United States Patent
Li et al.

(10) Patent No.: US 9,912,343 B1
(45) Date of Patent: Mar. 6, 2018

(54) ANALOG TO DIGITAL CONVERTER WITH BACKGROUND CALIBRATION TECHNIQUES

(71) Applicant: Analog Devices, Inc., Norwood, MA (US)

(72) Inventors: Hongxing Li, Andover, MA (US); Michael Mueck, Andover, MA (US); Michael C. W. Coln, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 15/371,864

(22) Filed: Dec. 7, 2016

(51) Int. Cl.
H03M 1/12 (2006.01)
H03M 1/10 (2006.01)
H03M 1/46 (2006.01)

(52) U.S. Cl.
CPC ....... H03M 1/1009 (2013.01); H03M 1/1245 (2013.01); H03M 1/466 (2013.01)

(58) Field of Classification Search
CPC ...... H03M 1/468; H03M 1/466; H03M 1/804; H03M 1/1009; H03M 1/46; H03M 1/1057; H03M 1/1061; H03M 1/462; H03M 1/38; H03M 1/1038; H03M 1/1245; H03M 1/12; H03M 1/10; H03M 1/403; H03M 1/442
USPC .......................... 341/118, 120, 150, 155, 172
See application file for complete search history.

(56) References Cited

U.S. PATENT DOCUMENTS

| | | | |
|---|---|---|---|
| 4,641,129 A | 2/1987 | Doluca et al. | |
| 5,006,854 A | 4/1991 | White et al. | |
| 6,778,123 B1 * | 8/2004 | Bock | H03M 1/1019 341/118 |
| 6,894,627 B2 | 5/2005 | Janakiraman et al. | |
| 7,006,028 B2 | 2/2006 | Galton | |
| 7,312,734 B2 | 12/2007 | McNeill et al. | |
| 7,609,184 B2 | 10/2009 | Kuramochi et al. | |
| 8,587,466 B2 * | 11/2013 | Debnath | H03M 1/145 341/155 |
| 8,653,998 B2 | 2/2014 | Haneda et al. | |
| 8,766,839 B2 * | 7/2014 | Janakiraman | H03M 1/0697 341/150 |

(Continued)

OTHER PUBLICATIONS

"U.S. Appl. No. 15/019,381, Non Final Office Action mailed May 27, 2016", 9 pgs.

(Continued)

*Primary Examiner* — Linh Nguyen

(74) *Attorney, Agent, or Firm* — Schwegman Lundberg & Woessner, P.A.

(57) ABSTRACT

Various techniques that can provide a capability to background calibrate ADC linearity error, e.g., due to capacitor mismatch drift and other parameter drift, during normal ADC operation in which analog-to-digital signal conversions are ongoing. A method can include grouping capacitors of an ADC into multiple clusters and calibrating under an arbitrary signal condition. To quickly converge the calibration result, the same arbitrary signal can be converted twice, and the capacitor(s) being calibrated can be modulated after first conversion. The difference between the results of the first and second conversions can contain the error information that can be used for calibration, and the signal component can be removed by this process. These techniques can provide improved linearity at 20-bit level and beyond.

22 Claims, 8 Drawing Sheets

(56) References Cited

U.S. PATENT DOCUMENTS

| | | | | |
|---|---|---|---|---|
| 8,907,826 | B2* | 12/2014 | Hong | H03M 1/1071 341/118 |
| 9,054,727 | B2 | 6/2015 | Steensgaard-Madsen | |
| 9,362,937 | B1 | 6/2016 | Burgio et al. | |
| 9,362,938 | B2* | 6/2016 | Zare-Hoseini | H03M 1/1071 |
| 9,608,655 | B1 | 3/2017 | Li et al. | |
| 2010/0079317 | A1* | 4/2010 | Feddeler | H03M 1/1038 341/120 |
| 2010/0079325 | A1* | 4/2010 | Berens | H03M 1/007 341/145 |
| 2010/0090873 | A1* | 4/2010 | Yang | H03M 1/1061 341/118 |
| 2012/0075128 | A1* | 3/2012 | Aruga | H03M 1/1019 341/110 |
| 2012/0256774 | A1* | 10/2012 | Dey | H03M 1/109 341/120 |
| 2013/0044015 | A1* | 2/2013 | Reinhold | H03M 1/1061 341/110 |
| 2013/0088375 | A1* | 4/2013 | Wu | H03M 1/1047 341/120 |
| 2016/0182075 | A1* | 6/2016 | Devarajan | H03M 1/1019 341/120 |

OTHER PUBLICATIONS

"U.S. Appl. No. 15/170,051, Notice of Allowance mailed Nov. 16, 2016", 9 pgs.

"Digital Calibration of SAR ADC", Proceeding of the 10th Internation Converence on Sampling Theory and Applications (SampTA 2013), [Online] retrieved from the internet:http://www.eurasip.org/Proceedings/Ext/SampTA2013/papers/p544-chiu.pdf,, (Jul. 2013).

Hong, Hyeok-Ki, et al., "A 2.6b/cycle-Architecture-Based 10b 1.7GS/s 15.4mW 4+-Time-Interleaved SAR ADC with a Multistep Hardware-Retirement Technique", ISSCC 2015 / Session 26, (2015), 3 pgs.

Kapusta, Ron, et al., "A 14b 80 MS/s SAR ADC With 73.6 dB SNDR in 65 nm CMOS", IEEE Journal of Solid-State Circuits, vol. 48, No. 12, (Dec. 2013), 8 pgs.

Liu, Chun-Cheng, et al., "A 10b 100MS/s 1.13mW SAR ADC with Binary-Scaled Error Compensation", ISSCC 2010 / Session 21, (2010), 3 pgs.

Liu, Wenbo, et al., "A 12-bit, 45-MS/s, 3-m W Redundant Successive-Approximation-Register Analog-to-Digital Converter With Digital Calibration", IEEE Journal of Solid State Circuits, vol. 46, No. 11, (Nov. 2011), 2661-2672.

Wang, et al., "IRD Digital Background Calibration of SAR ADC With Coarse Reference ADC Acceleration", IEEE Transactions on Circuits and Systems—II: Express Briefs, vol. 61, No. 1., (Jan. 2014).

Ding, Ming, et al., "A 5.5fJ/conv-step 6.4MS/s 13b SAR ADC Utilizing a Redundancy-Facilitated Background Error-Detection-and-Correction Scheme", 2015 IEEE International Solid-State Circuits Conference, (2015), 460-461.

Hurrell, Christopher P., et al., "An 18b 12.5MHz ADC with 93dB SNR", 2010 IEEE International Solid-State Circuits Conference, (2010), 378-379.

McLachlan, Roddy C., et al., "A 20b Clockless DAC With Sub-ppm INL, 7.5 nV/vHz Noise and 0.05 ppm/°C Stability", IEEE Journal of Solid-State Circuits, vol. 48, No. 12, Dec. 2013, (Dec. 12, 2013), 3028-3037.

McNeill, John A., et al., "All-Digital Background Calibration of a Successive Approximation ADC Using the "Split ADC" Architecture", IEEE Transactions on Circuits and Systems—Regular Papers, vol. 58, No. 10, (Oct. 2011), 2355-2365.

Xu, Hongda, et al., "A 78.5dB-SNDR Radiation- and Metastability-Tolerant Two-Step Split SAR ADC Operating up to 75MS/s with 24.9mW Power Consumption in 65nm CMOS", 2017 IEEE International Solid-State Circuits Conference, (2017), 475-477.

U.S. Appl. No. 15/019,381, filed Feb. 9, 2016, ADC Background Calibration with Dual Conversions.

U.S. Appl. No. 15/170,051, filed Jun. 1, 2016, ADC Background Calibration with Dual Conversions.

* cited by examiner

ANALOG TO DIGITAL CONVERTER WITH BACKGROUND CALIBRATION TECHNIQUES

FIELD OF THE DISCLOSURE

The present disclosure relates to the field of analog to digital converter circuits and systems.

BACKGROUND

Electronic systems can include analog-to-digital (A/D) converters (ADCs). Converting analog signals to digital quantities allows processors in electronic systems to perform signal processing functions for the systems. Performance of ADC circuits can depend on environmental conditions such as temperature and on variations that can occur during manufacturing. A higher accuracy ADC circuit (e.g., in which the number of bits of the ADC circuit is twelve or greater) may need calibration multiple times during its working life to avoid bit weight errors. The present inventors have recognized a need for improved calibration of ADCs.

SUMMARY OF THE DISCLOSURE

This document relates generally to analog-to-digital converter (ADC) circuits, and in particular to calibration of ADC circuits.

In some aspects, this disclosure is directed to a method of performing a calibration for an analog-to-digital converter system that includes a plurality of capacitors. The method comprises acquiring a first sample of an analog signal on at least some of the plurality of capacitors; grouping the plurality of capacitors into at least a first cluster of capacitors and a second cluster of capacitors; grouping the first cluster into a first combination of capacitors having a nominal first weight for representing at least a first bit, and grouping the second cluster into a first combination of capacitors having a nominal second weight different than the nominal first weight for representing at least a second bit; selecting a plurality of the first combination of capacitors from one of the first cluster and the second cluster and applying a first reference voltage and selecting a plurality of the first combination of capacitors from the other of the first cluster and the second cluster and applying a second reference voltage, wherein a sum of the weights of the selected capacitors to which the first reference voltage was applied equals a sum of the weights of the selected capacitors to which the second reference voltage was applied; performing a first analog-to-digital conversion of the analog sample using the first combination to generate a first digital output D1; applying the second reference voltage to the previously selected capacitors to which the first reference voltage was applied and applying the first reference voltage to the previously selected capacitors to which the second reference voltage was previously applied; performing at least a partial second analog-to-digital conversion of the same analog sample using the first combination of capacitors to generate a second digital output D2; and determining a difference between the first digital output D1 and the second digital output D2 to generate an estimate of a first error of the plurality of capacitors.

In some aspects, this disclosure is directed to a method of performing a calibration for an analog-to-digital converter system that includes a capacitive digital to analog converter having a first plurality of capacitors and a capacitor bank having a second plurality of capacitors. The method comprises acquiring a first sample of an analog signal on at least some of the first plurality of capacitors; grouping the first plurality of capacitors into at least a first cluster of capacitors and a second cluster of capacitors; grouping the first cluster into a first combination of capacitors having a nominal first weight to receive a first reference voltage and grouping the second cluster into a first combination of capacitors having a nominal second weight different than the nominal first weight; selecting a first group of capacitors from the second plurality of capacitors of the capacitor bank having the first nominal weight and applying a second reference voltage; performing a first analog-to-digital conversion of the analog sample using the first combination to generate a first digital output D1; applying the second reference voltage to the first combination of capacitors and applying the first reference voltage to the previously selected first group of capacitors of the capacitor bank to which the second reference voltage was previously applied, performing at least a partial second analog-to-digital conversion of the same analog sample using the first combination of capacitors to generate a second digital output D2; and determining a difference between the first digital output D1 and the second digital output D2 to generate an estimate of a first error of the plurality of capacitors.

In some aspects, this disclosure is directed to a system for performing a calibration for an analog-to-digital converter system that includes a capacitive digital to analog converter having a first plurality of capacitors and a capacitor bank having a second plurality of capacitors. The system comprises means for acquiring a first sample of an analog signal on at least some of the plurality of capacitors; means for grouping the plurality of capacitors into at least a first cluster of capacitors and a second cluster of capacitors; means for grouping the first cluster into a first combination of capacitors having a nominal first weight for representing at least a first bit, and grouping the second cluster into a first combination of capacitors having a nominal second weight different than the nominal first weight for representing at least a second bit; means for selecting a plurality of the first combination of capacitors from one of the first cluster and the second cluster and applying a first reference voltage and selecting a plurality of the first combination of capacitors from the other of the first cluster and the second cluster and applying a second reference voltage, wherein a sum of the weights of the selected capacitors to which the first reference voltage was applied equals a sum of the weights of the selected capacitors to which the second reference voltage was applied; means for performing a first analog-to-digital conversion of the analog sample using the first combination to generate a first digital output D1; means for applying the second reference voltage to the previously selected capacitors to which the first reference voltage was applied and applying the first reference voltage to the previously selected capacitors to which the second reference voltage was previously applied; means for performing at least a partial second analog-to-digital conversion of the same analog sample using the first combination of capacitors to generate a second digital output D2; and means for determining a difference between the first digital output D1 and the second digital output D2 to generate an estimate of a first error of the plurality of capacitors.

This overview is intended to provide an overview of subject matter of the present patent application. It is not intended to provide an exclusive or exhaustive explanation of the invention. The detailed description is included to provide further information about the present patent application.

Figure 1:
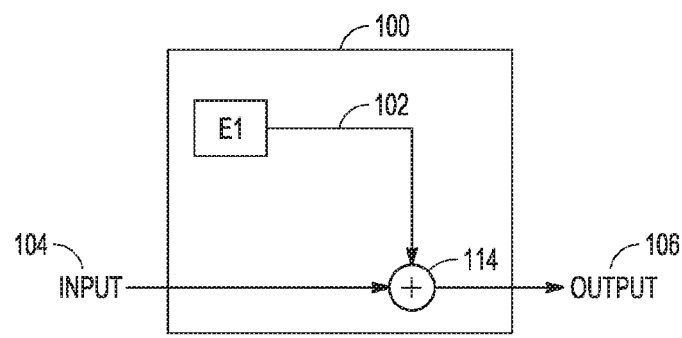
FIG. 1 is a simplified conceptual diagram depicting an error source adding error to an input signal.

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

As explained previously herein, higher accuracy ADCs may need repeated calibration. In general, there are two types of ADC calibration: foreground calibration and background calibration. Foreground calibrations are usually done at factory test or at chip power up, or at any other chosen time slots dedicated for the ADC calibration. In an example of foreground calibration, an accurate sinewave signal is fed into the ADC input and all the associated ADC bit weights are calibrated using the accurate sinewave signal. In another example, the lower bits of the ADC are used as a reference to measure and calibrate the bit weights of the most significant bits (MSBs) of the ADC. The downside of foreground calibration is that it does not track chip supply and temperature changes when performed only at the factory. Also, it may involve extra manufacturing test cost and it may be necessary to interrupt the operation of the ADC to perform calibration during use in the field.

In comparison, background calibration works in the background and can be transparent to the normal ADC operation during which analog-to-digital signal conversions are ongoing. Also, because background calibration works in the background of normal operation, it may track the effects of supply and temperature on the ADC bit weights.

One approach of background calibration is to use one or more redundant ADC channels. One of the ADC channels is used during normal operation, while at least one of the unused ADC channels is calibrated. The used ADC can be swapped out for the ADC that was calibrated, and the ADC channels can continue to be swapped out until all the ADC channels are calibrated. The downside of most such background calibration methods can include one or both of high analog/digital circuit complexity and long convergence time.

Capacitor voltage coefficient temperature drift and offset drift can also calibrated in the background by monitoring chip temperature and applying correction accordingly. Although systematic drift due to change of temperature, for example, can be corrected in field by using an on-chip temperature monitor, capacitors can be significantly affected from stress, temperature change and other unknown factors.

This disclosure describes various techniques that can provide a capability to background calibrate SAR ADC linearity error, e.g., due to capacitor mismatch drift and other parameter drift, including during normal ADC operation in which analog-to-digital signal conversions are ongoing. In accordance with various techniques of this disclosure, capacitors of an ADC can be grouped into multiple clusters and calibrated under an arbitrary signal condition. To quickly converge the calibration result, the same arbitrary signal sample can be converted twice, and the capacitor(s) being calibrated can be modulated after first conversion. The difference between the results of the first and second conversions can contain the error information that can be used for calibration, and the signal component can be removed by this process. These techniques can provide improved linearity at 20-bit level and beyond.

FIG. 1 is a simplified conceptual diagram depicting an error source adding error to an input signal. In an analog-to-digital converter (ADC) circuit 100, an error source E1, e.g., capacitor mismatch, can generate an error 102 that is mixed together with an input signal 104. Without further processing, the error 102 cannot be distinguished from the output signal 106 and, as such, it is not possible to determine how much error has been added.

Using various techniques of this disclosure, the error can be modulated and added to the input signal. The output signal 106 can include the modulated error mixed with the input signal. To extract an estimation of the error, the modulated error mixed with the input signal can be demodulated.

Figure 2:
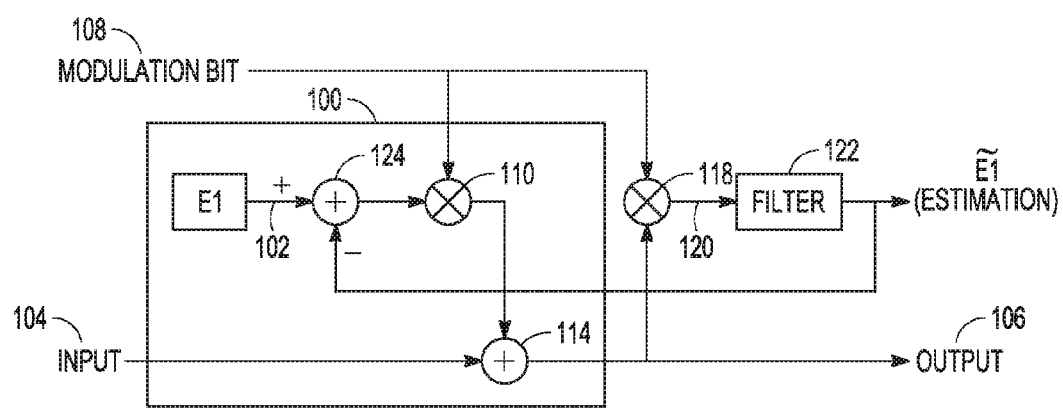
FIG. 2 is a simplified conceptual diagram depicting an example background calibration technique in accordance with this disclosure.

FIG. 2 is a simplified conceptual diagram depicting an example background calibration technique in accordance with this disclosure. A modulation bit 108, e.g., random bit, can be applied to a first mixer circuit 110, e.g., a modulator, of the ADC 100 along with the error from the error source E1. The mixer 110 can output the modulated error 112, which can be added to the input signal at adder circuit 114. The output signal 106 at can include the modulated error 112 mixed with the input signal 104.

The output signal 106 that can include the modulated error 112 mixed with the input signal 104 can be applied to a second mixer circuit 118, e.g., a demodulator. The same bit 108, e.g., random or pseudo-random, applied to the first mixer 110 can be applied to the second mixer 118. The output 120 of the second mixer 118 can include the error 102 and the input signal 104 modulated by the second mixer 118.

In the example configuration in FIG. 2, a filter circuit 122, e.g., an integrator, can be included and used to filter out the signal component and provide an estimate of the error. At the input of the filter 122, the error is DC but the input signal has been transformed into noise by the modulation.

In the example shown in FIG. 2, the estimated error E1 can be applied to an adder 124 at the error source E1 and used to correct the ADC output. In other examples (not shown), the estimated error E1 can be applied to the ADC output to correct for the error.

Figure 3:
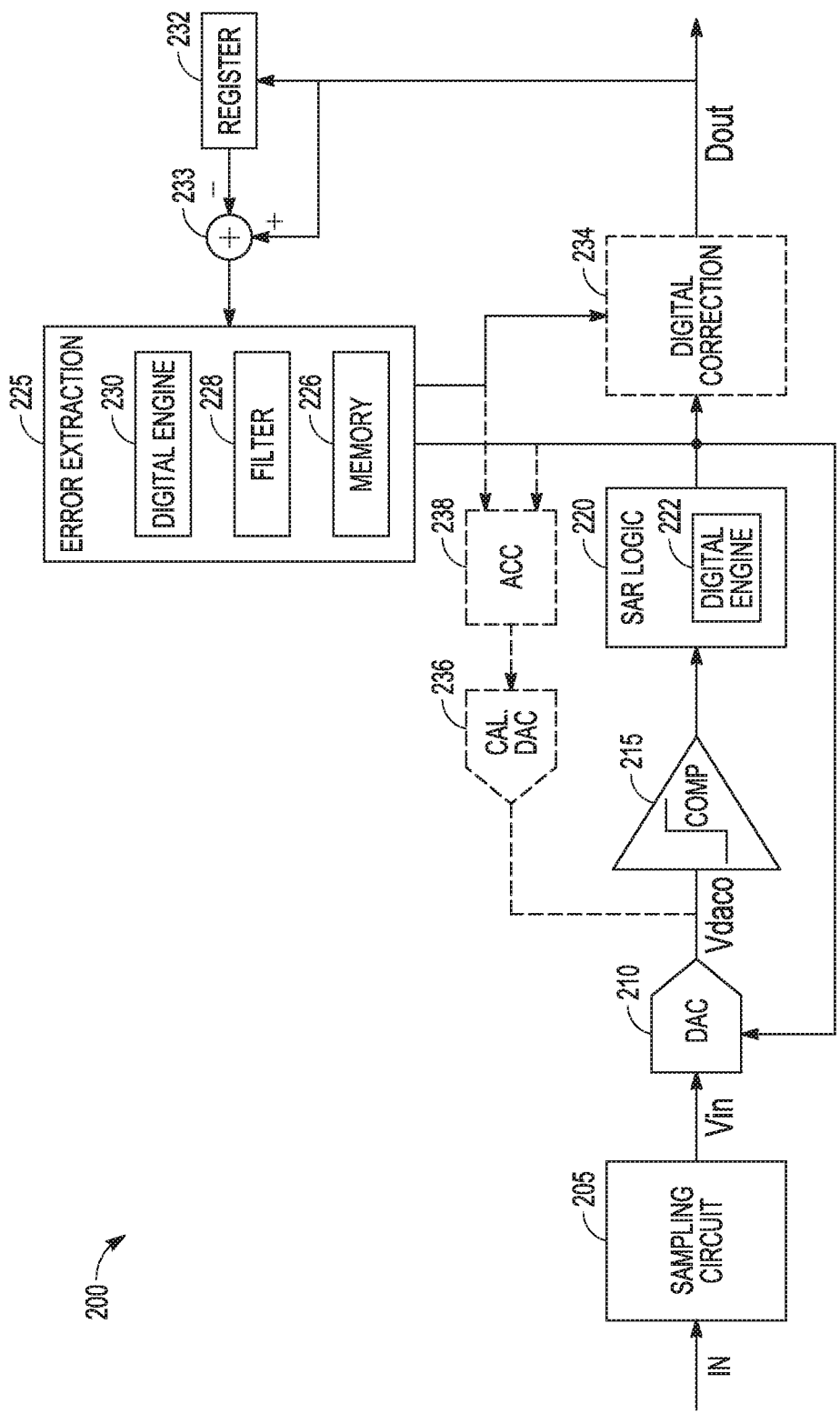
FIG. 3 is a functional block diagram of an example of an N-bit successive approximation register (SAR) ADC circuit that can implement various techniques of this disclosure.

FIG. 3 is a functional block diagram of an example of an N-bit successive approximation register (SAR) ADC circuit that can implement various techniques of this disclosure. The ADC circuit 200 can implement various techniques described above with respect to the simplified ADC 100 of FIG. 2.

The SAR ADC circuit 200 can include a digital-to-analog converter (DAC) circuit 210, e.g., a capacitor DAC, a sampling circuit 205 that can be included in the DAC circuit 210, a comparator circuit 215, and logic circuitry 220. The circuit 200 can include an error extraction circuit 225 that can include a memory circuit 226, a filter circuit 228, and a digital engine circuit 230. The filter 228 can be similar to the filter 122 of FIG. 2. The circuit 200 can include a register 232. For corrections in the digital domain, the circuit 200 can include a digital correction circuit 234 in some example implementations to apply a digital representation of the error estimate to the digital output Dout to correct the ADC output. Bit trial decision results from the SAR logic 220 can be sent to both the digital correction circuit 234 and the error extraction circuit 225. The error extraction circuit 225 can extract information regarding any capacitor mismatches and can store the extracted error for each capacitor as a coefficient per capacitor.

As described in detail below, the circuit 200 can perform a first analog-to-digital conversion of an analog sample to generate a first digital output that is sent to the register 232 and, after a "swap" of capacitors, the circuit 200 can perform a second analog-to-digital conversion of the same analog sample to generate a second digital output that is subtracted from the first digital output by adder 233. The difference between the digital outputs is fed to the error extraction circuit 225 to determine the error. In some examples, the digital engine 230 of the error extraction circuit 225 can apply a filter, e.g., filter 228, to the determined differences in order to refine the estimate error. As an example, the filter can include an integrator. In some example, the filter can be a digital filter. In some examples, the digital engine 230 can store in a data structure in a memory device, e.g., the memory 226, a correspondence between a representation of the estimate of the error and the combinations of capacitors used in the swap. Each individual capacitor's coefficient can be extracted and updated based this information.

For corrections in the analog domain, the circuit 200 can include a calibration DAC circuit 236 and an accumulator circuit 238 in some example implementations to apply an analog signal 224 representing the error estimate to the DAC 210. In analog domain implementations, the output Dout of the SAR logic circuit 220 can also connected to the register 232. Based on the bit trial results, the accumulator 238 can accumulate the total capacitor mismatch error, e.g., by accumulating the capacitor coefficients. The calibration DAC can help load a fractional portion of the accumulated error onto the DAC 210.

In some example implementations, the digital correction circuit 234, the calibration DAC circuit 236, and the accumulator circuit 238 can be used together.

The DAC circuit 210 can include at least N weighted circuit components, such as in which the weight (e.g., capacitance value) of a particular weighted circuit component can be specified relative to that of one or more other weighted circuit components, with N being a positive integer. In certain examples, N is equal to sixteen and the weighted circuit components include sixteen capacitors (for example, with the sixteen capacitors including different multiples of a specified unit capacitor to obtain the weighting relative to each other). The sampling circuit 205 can sample an input voltage at an input to the ADC circuit and can hold a sampled voltage for comparison to another voltage using the weighted circuit components.

An output voltage of the DAC circuit 210 (Vdaco) can be compared to the sampled and held voltage, such as using a comparator circuit 215. The bit values of the DAC circuit 210 can be adjusted, such as based on the output of the comparator circuit 215. The conversion may start with the DAC set to midscale, in an example. The comparator 215 can determine whether the DAC output is greater or less than the sampled input voltage, and the comparison result can be stored as a one or zero for that bit of the DAC. Conversion then proceeds to the next bit value until all bits of the digital value are determined. One iteration of changing the DAC output and comparing the voltage to the input voltage can be referred to as a bit trial or a bit determination.

The SAR logic circuitry 220 can control the ADC operation, such as during the bit trials (charge balancing a reference charge stored on the bit trial capacitors against the sampled charge stored on the sampling capacitors). The SAR logic circuitry 220 initiates one sample of the input voltage, initiates the first conversion of the sampled input voltage to a first set of bit values, such as using a first set of bit trials, and initiates a second conversion of the sampled input voltage to a second set of bit values, such as using a second set of bit trials.

The logic circuitry can include a state machine or other digital engine 222 to perform functions such as progressing the ADC through different states of operation and to perform the calculations described. As in the method of FIG. 1, at least a portion of the bit trial results used in the second conversion can be made different from the bit trial results used in the first conversion, e.g., by shuffling, dithering, or the like, such that different component values or conversion comparison criteria can be used between the first and second conversions. The logic circuitry 220 can determine the final N-bit digital value for the sampled input voltage using the first set of bit values and the second set of bit values, and the final N-bit digital value can be made available at output Dout.

It should be noted that the although the calibration techniques of this disclosure are described with respect to a SAR ADC, e.g., the SAR ADC of FIG. 3, the calibration techniques are not limited to SAR ADCs. Rather, the calibration techniques can also be applied to delta-sigma ADCs, pipelined ADCs, pipelined SAR ADCs, as well as other ADCs. In addition, in some implementations, the calibration techniques can be performed in the foreground.

Figure 4:
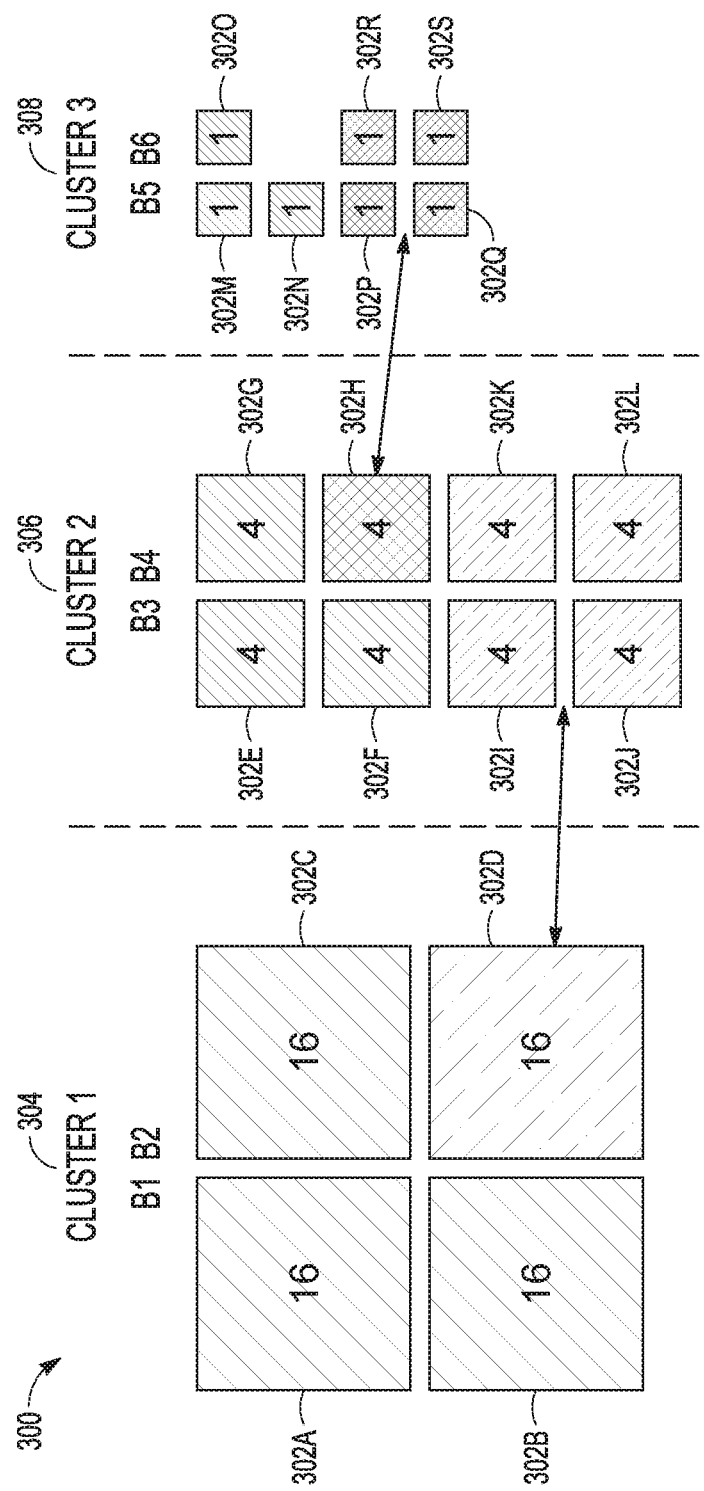
FIG. 4 is a simplified conceptual diagram depicting an example background calibration technique in accordance with this disclosure.

FIG. 4 is a simplified conceptual diagram depicting an example background calibration technique in accordance with this disclosure. FIG. 4 conceptually depicts a portion of a capacitor digital-to-analog converter (CDAC) circuit array 300, e.g., DAC 210 of FIG. 3, that can include a plurality of capacitors 302A-302S (collectively referred to as "capacitors 302"). In the example shown in FIG. 4, the plurality of capacitors 302 can be grouped into at least a first cluster 304 of capacitors and a second cluster 306 of capacitors. The specific example shown in FIG. 4 depicts a third cluster 308 of capacitors. In other example configurations, there can be more or less than three clusters.

The CDAC array, e.g., DAC array 210 of FIG. 3, can include a group of capacitors representing at least some of the MSBs of the digital value represented by a plurality of bits. In some examples, the CDAC array can include another group of capacitors representing the LSBs of the digital value represented by the plurality of bits. In the simplified example shown in FIG. 4, the first cluster 304 can include capacitors representing bits B1 and B2, the second cluster 306 can include capacitors representing bits B3 and B4, and the third cluster 308 can include capacitors representing bits B5 and B6. The example shown in FIG. 4 depicts a thermometer encoded scheme in which two bits (B1, B2) control 3 capacitors in the first cluster 304; two bits (B3, B4) control 3 capacitors in the second cluster 306; and two bits (B5, B6) control 3 capacitors and in the third cluster 308.

In some example implementations, each of the clusters 304, 306, and 308 can include a defined number of equivalent sized capacitors, e.g., unit capacitors. In some examples, a cluster can include sampling capacitors used for sampling, and/or the cluster can include non-sampling capacitors, e.g., for applying dither. For example, in FIG. 4, the first cluster 304 can include sampling capacitors while the second cluster 306 and the third cluster 308 can include non-sampling capacitors.

After the capacitors in the CDAC 300 have been grouped in at least two clusters, e.g., first and second clusters 304, 306, various capacitors in the respective clusters can be grouped into combinations of capacitors. For example, in the first cluster 304, the capacitors can be grouped into a first combination of capacitors 302A, 302B, 302C, and 302D, each having a nominal first weight for representing at least a first bit B1 (cluster 304 also depicts another bit B2 and can include more than one or two bits). In the second cluster 306, the capacitors can be grouped into a first combination of capacitors 302E, 302F, 302G, 302H, 302I, 302J, 302K, and 302L, each having a nominal second weight for representing at least a second bit B3 (cluster 306 also depicts another bit B4 and can include more than one or two bits).

The first and second nominal weights can be different to reflect the difference in bit weights of the first and second clusters 304, 306. In FIG. 4, the difference in the first and second weights is depicted both graphically and numerically. For example, a capacitor in the first cluster 304, e.g., the capacitor 302A, is graphically depicted as being larger than a capacitor in the second cluster 306, and a capacitor in the second cluster 306 is graphically depicted as being larger than a capacitor the third cluster 308. In addition, a capacitor in the first cluster 304, e.g., the capacitor 302A, is numerically depicted as being larger (value of 16) than a capacitor in the second cluster 306 (value of 4) (and the third cluster 308, value of 1). These specific numbers are for the purposes of explanation and not to be considered limiting.

In some implementations, a capacitor in the first cluster 304, e.g., the capacitor 302A, is not actually a larger capacitor than a capacitor in the second cluster 306, e.g., the capacitor 302E, but instead includes a greater number of the same size capacitors, e.g., unit capacitors. For example, a capacitor of the first cluster 304, e.g., the capacitor 302A, can include 16 unit capacitors and a capacitor of the second cluster 306, e.g., the capacitor 302E, can include 4 unit capacitors.

In some examples, at least some of the capacitors in a cluster can include bit trial capacitors in addition to capacitors used for calibration purposes. Bit trial capacitors are capacitors within the DAC to which a reference voltage is applied to balance against the charge stored by the sampling capacitors in the DAC.

An analog signal for sampling can be applied to an input of an ADC, e.g., the SAR ADC of FIG. 3. Then, a first sample of the analog signal can be acquired on at least some of the plurality of capacitors of the CDAC array of FIG. 4, e.g., DAC 210 of FIG. 3. For example, the first sample can be acquired on at least some of the capacitors in the first cluster 304.

As mentioned above, using various techniques of this disclosure, the error, e.g., capacitor mismatch in the CDAC array 300, can be modulated and added to the input signal. Then, to extract an estimation of the error, the modulated error mixed with the input signal can be demodulated.

In some example implementations, the error can be modulated by selecting a plurality of the first combination of capacitors from one of the first cluster 304 and the second cluster 306 and applying a first reference voltage, e.g., positive reference voltage, and selecting a plurality of the first combination of capacitors from the other of the first cluster 304 and the second cluster 306 and applying a second reference voltage, e.g., a negative reference voltage, where a sum of the weights of the selected capacitors to which the first reference voltage was applied equals a sum of the weights of the selected capacitors to which the second reference voltage was applied. In the example above, the capacitors in the first cluster 304 were grouped into a first combination of capacitors 302A, 302B, 302C, and 302D having a nominal first weight, e.g., value of 16, for representing at least a first bit B1 (cluster 304 also depicts another bit B2 and can include more than one or two bits) and in the second cluster 306, the capacitors were grouped into a first combination of capacitors 302E, 302F, 302G, 302H, 302I, 302J, 302K, and 302L having a nominal second weight, e.g., value of 4, for representing at least a second bit B3 (cluster 306 also depicts another bit B4 and can include more than one or two bits).

To modulate the error, capacitors in the first cluster 304 can be selected to receive a first reference voltage and capacitors in the second cluster 306 can be selected to receive a second reference voltage in complementary fashion. This process is referred to in this disclosure as "swapping" or a "swap" and the capacitors involved in the "swapping" are referred to as "swap caps" or "swap capacitors."

In some example implementations, the plurality of the first combination of capacitors from one of the first cluster and the second cluster can be dynamically selected. Dynamically selecting capacitors from amongst the capacitors in a cluster can include at least one of the following techniques: randomly selecting, pseudo-randomly selecting, barrel-shifting, and deterministically selecting.

Continuing with the example from above, a digital engine, e.g., the digital engine 222 of FIG. 3, can select the plurality of capacitors that make up capacitor 302D from the first cluster 304 and apply a first reference voltage, e.g., positive reference voltage, and can select the plurality of capacitors that make up capacitors 302I-302L from the second cluster 306 and apply a second reference voltage, e.g., a negative reference voltage, where a sum of the weights of the selected capacitors to which the first reference voltage was applied equals a sum of the weights of the selected capacitors to which the second reference voltage was applied. That is, the selected capacitors 302D have a weight of 16 and the selected capacitors of 302I-302L have a weight of 4×4=16. The swapping is complementary between clusters.

Next, an ADC, e.g., the SAR ADC of FIG. 3, can perform a first analog-to-digital conversion of the analog sample using the first combination to generate a first digital output D1. Continuing the example above, the DAC 210 of FIG. 3 can use the first combination of capacitors 302A, 302B, 302C, and 302D of the first cluster 304 and the first combination of 302E, 302F, 302G, 302H, 302I, 302J, 302K, and 302L of the second cluster 306 to generate a first digital output D1.

The ADC can then apply the second reference voltage to the previously selected capacitors to which the first reference voltage was applied and apply the first reference voltage to the previously selected capacitors to which the second reference voltage was previously applied. In other words, the ADC can "swap" the capacitors between the two clusters. This "swapping" can introduce a modulation into the digital output data from the ADC that represents the misweighting between the capacitors.

Continuing the example above, the plurality of capacitors that make up capacitor 302D can be selected to receive the second reference voltage, e.g., charged to a negative reference voltage, from the first cluster 304 and the plurality of capacitors that make up capacitor 302I-302L can be selected to receive the first reference voltage, e.g., charged to a positive reference voltage, from the second cluster 306, where a sum of the weights of the selected capacitors to which the first reference voltage was applied equals a sum of the weights of the selected capacitors to which the second reference voltage was applied. That is, the selected capacitors 302D have a weight of 16 and the selected capacitors of 302I-302L have a weight of 4×4=16, where the selected capacitors 302D and the selected capacitors 302I-302L are oppositely charged.

On the same analog sample, the ADC, e.g., the SAR ADC of FIG. 3, can perform at least a partial second analog-to-digital conversion using the first combination to generate a second digital output D2. Continuing the example above, the DAC 210 of FIG. 3 can use the first combination of capacitors 302A, 302B, 302C, and 302D of the first cluster 304 and the first combination of 302E, 302F, 302G, 302H, 302I, 302J, 302K, and 302L of the second cluster 306 to generate a second digital output D2. Again, the ADC performs the conversion on the same analog sample.

After generating the two digital outputs D1 and D2, a controller, e.g., the digital engine 225 of FIG. 3, can determine a difference between the first digital output D1 and the second digital output D2 to generate an estimate of a first error of the plurality of capacitors. Again, this estimate of error can represent the misweighting between the selected capacitors of the first and second clusters, for example. The ADC can, for example, store the first error in a data structure in a memory device, e.g., the memory 226 of FIG. 3, that relates the determined first error to the capacitors that were selected to receive reference voltages in the first and second clusters 304, 306. That is, the ADC can store a correspondence between a representation of the estimate of the first error and the plurality of the first combinations of capacitors in the first and second clusters.

In configurations with a third cluster 308, as in FIG. 4, a similar process can be used to determine an error between capacitors between the second and third clusters 306, 308. For example, following acquisition of a sample, capacitors from the second cluster 306 can be selected to receive a first reference voltage and capacitors from the third cluster 308 can be selected to receive a second reference voltage in a manner similar to that described above, and a first conversion can be performed to generate a digital output. The selected capacitors of the second and third clusters 306, 308 can be swapped, and a second conversion can be performed another digital output. The digital engine, e.g., digital engine 225 of FIG. 3, can determine a difference between the digital outputs that is an estimate of error that can represent the misweighting between the selected capacitors of the second and third clusters 306, 308. The ADC can, for example, store the error in a data structure in a memory device, e.g., the memory 226 of FIG. 3, that relates the determined error to the capacitors that were selected in the second and third clusters 306, 308.

By using these techniques, the mismatch error of the selected capacitors can be determined. As described below and in accordance with this disclosure, the capacitors within respective clusters can be "shuffled" and regrouped, and then selected to receive a reference voltage in the manner described above to determine further estimates of error.

Figure 5:
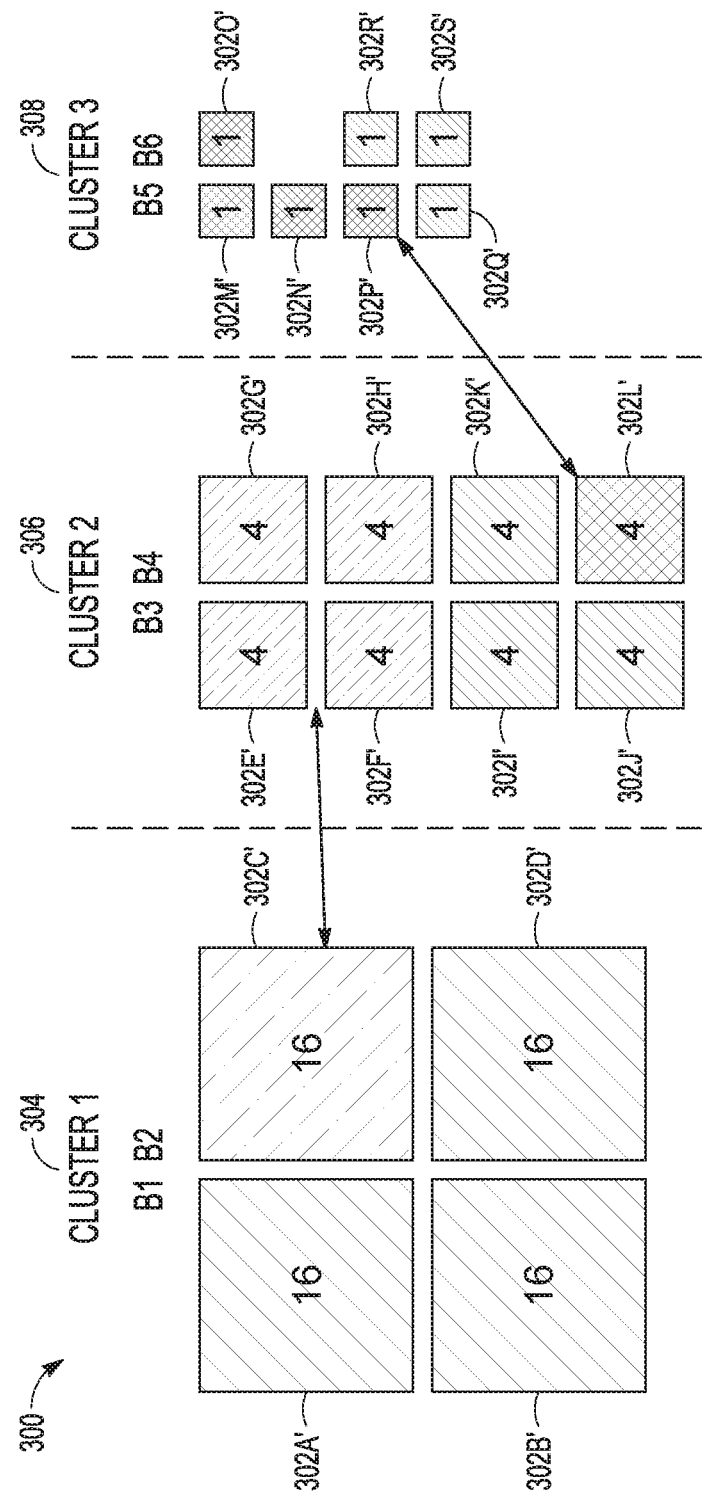
FIG. 5 is a simplified conceptual diagram depicting an example background calibration technique in accordance with this disclosure.

FIG. 5 is a simplified conceptual diagram depicting an example background calibration technique in accordance with this disclosure. FIG. 5 conceptually depicts the portion of the CDAC array of FIG. 4 after a "shuffling" of capacitors in respective clusters.

Continuing with the example above, a digital engine, e.g., digital engine 222 of FIG. 3, can group the first cluster 304 into a second combination of capacitors having a nominal first weight for representing at least the first bit B1 (cluster 304 also depicts another bit B2 and can include more than one or two bits) and can group the second cluster 306 into a second combination of capacitors having a nominal second weight different than the nominal first weight for representing at least a second bit B3 (cluster 306 also depicts another bit B4 and can include more than one or two bits).

For example, in the first cluster 304, the capacitors can be grouped into a second combination of capacitors 302A', 302B', 302C', and 302D', each having a nominal first weight for representing at least a first bit B1. In the second cluster 306, the capacitors can be grouped into a second combination of capacitors 302E', 302F', 302G', 302H', 302I', 302J', 302K', and 302L', each having a nominal second weight for representing at least a second bit B3. It should be understood that the capacitors representing capacitors 302A, 302B . . . 302L in FIG. 4 represent a different permutation of capacitors than capacitor 302A', 302B' . . . 302L' in FIG. 5. The first and second nominal weights can be different, e.g., value 16 in the first cluster and value 4 in the second cluster, to reflect that the difference in bit weights, as described above with respect to FIG. 4. Again, this regrouping into a second combination within clusters can be referred to as a "shuffling" of the capacitors. Once the capacitors within a cluster have been "shuffled", the process described above with respect to FIG. 4 can be repeated.

A second sample of the analog signal can be acquired on at least some of the plurality of capacitors of the CDAC array 300 of FIG. 5, e.g., DAC 210 of FIG. 3. For example, the second sample can be acquired on at least some of the capacitors in the first cluster 304.

To modulate the error, capacitors in the first cluster 304 can be selected to receive the first reference voltage and capacitors in the second cluster 306 can be selected to receive the second reference voltage in complementary fashion, or swapped, as described above. For example, the digital engine of the ADC, e.g., the digital engine 222 of FIG. 3, can select the plurality of capacitors that make up capacitor 302C' from the first cluster 304 to receive the first reference voltage and can select the plurality of capacitors that make up capacitors 302E'-302H' from the second cluster 306 to receive the second reference voltage, where a sum of the weights of the selected capacitors to receive the first reference voltage, e.g., value of 16 in the first cluster, equals a sum of the weights of the selected capacitors to receive the second reference voltage, e.g., value of 4×4=16 in the second cluster.

Next, an ADC, e.g., the SAR ADC of FIG. 3, can perform a first analog-to-digital conversion of the second analog sample using the first combination to generate a first digital output D1. Continuing the example above, the DAC 210 of FIG. 3 can use the second combination of capacitors 302A', 302B', 302C', and 302D' of the first cluster and the second combination of 302E', 302F', 302G', 302H1', 302I', 302J', 302K', and 302L' of the second cluster 306 to generate a third digital output D3.

The ADC can then apply the second reference voltage to the previously selected capacitors to which the first reference voltage was applied and apply the first reference voltage to the previously selected capacitors to which the second reference voltage was previously applied. In other words, the ADC can "swap" the capacitors between the two clusters. This "swapping" can introduce a modulation into the digital output data from the ADC that represents the misweighting between the capacitors.

Continuing the example above, the plurality of capacitors that make up capacitor 302C' can be selected to receive the second reference voltage, e.g., charged to a negative reference voltage, from the first cluster 304 and the plurality of capacitors that make up capacitors 302E'-302H' can be selected to receive the first reference voltage, e.g., charged to a positive reference voltage, from the second cluster 306, where a sum of the weights of the selected capacitors to which the second reference voltage was applied equals a sum of the weights of the selected capacitors to which the first reference voltage was applied. That is, the selected capacitors 302C' have a weight of 16 and the selected capacitors of 302E'-302H' have a weight of 4×4=16, where the capacitors are oppositely charged.

On the same analog sample, the ADC, e.g., the SAR ADC of FIG. 3, can perform at least a partial second analog-to-digital conversion using the second combination to generate a fourth digital output D4. Continuing the example above, the DAC 210 of FIG. 3 can use the second combination of capacitors 302A', 302B', 302C', and 302D' of the first cluster and the second combination of 302E', 302F', 302G', 302H', 302I', 302J', 302K', and 302L' of the second cluster 306 to generate a fourth digital output D4. Again, the ADC performs the second conversion on the same analog sample as the first conversion.

After generating the two digital outputs D3 and D4, a controller, e.g., the digital engine 225 of FIG. 3, can determine a difference between the third digital output D3 and the fourth digital output D4 to generate an estimate of a second error of the plurality of capacitors. Again, this estimate of error can represent the misweighting between the selected capacitors. The ADC can, for example, store the second error in a data structure in a memory device that relates the determined second error to the capacitors that were selected in the first and second clusters 304, 306. That is, the ADC can store a correspondence between a representation of the estimate of the second error and the plurality of the second combinations of capacitors in the first and second clusters.

In configurations with a third cluster 308, as in FIGS. 4 and 5, a similar process can be used to determine an error between selected capacitors between the second and third clusters 306, 308.

The techniques described above with respect to FIGS. 4 and 5 can optionally be performed in the background until the ADC has determined and stored a sufficient number of correspondences between representations of the error estimates and the combinations of capacitors in the first and second (or more) clusters that were used to determine the errors. In this manner, the ADC can determine error estimates for some or all of the capacitors in the CDAC array.

In some example implementations and as mentioned above with respect to FIG. 2, the ADC can apply a filter, e.g., filter 228 of FIG. 3, to the determined differences in order to refine the estimate error. As an example, the filter can include an integrator. In some example, the filter can be a digital filter.

As mentioned above with respect to FIG. 2, the estimated error can be applied at the error source, e.g., CDAC array, and used to correct the ADC output. For example, the ADC, e.g., of FIG. 3, can apply an analog signal 224 representing the error estimate to the DAC 210. In other example implementations, the estimated error can be applied digitally to the ADC digital output to correct for the error. For example, the digital engine, e.g., digital engine 225 of FIG. 3, can apply a digital representation of the error estimate to the digital output Dout to correct the ADC output.

In the example implementation described above with respect to FIGS. 4 and 5, the plurality of capacitors in the ADC, e.g., ADC of FIG. 3, formed part of the CDAC array 300, e.g., DAC 210 of FIG. 3. In other example implementations, the plurality of capacitors can form part of the CDAC array 300 and part of a separate capacitor bank of capacitors, as described below with respect to FIG. 6. As described below, the "swap" capacitors can be selected from capacitors in the capacitor bank.

Figure 6:
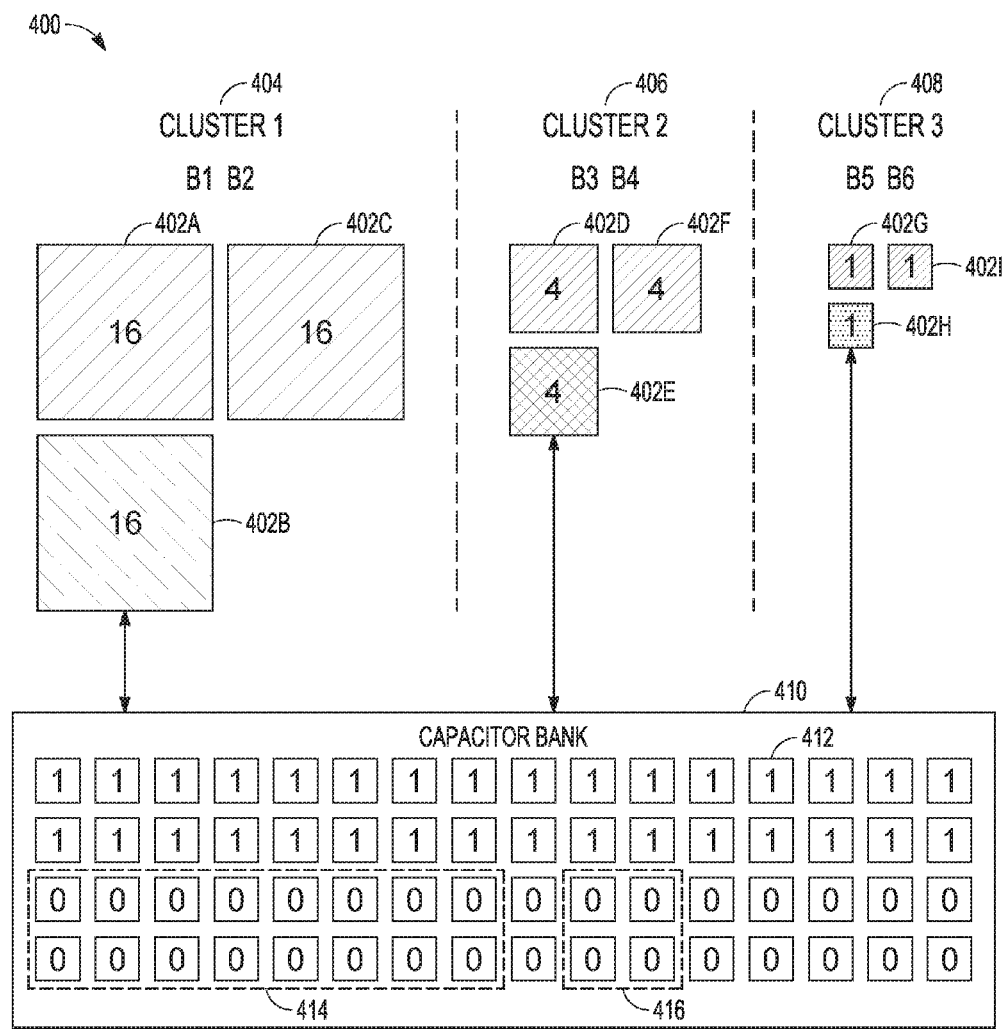
FIG. 6 is a simplified conceptual diagram depicting another example background calibration technique in accordance with this disclosure.

FIG. 6 is a simplified conceptual diagram depicting another example background calibration technique in accordance with this disclosure. FIG. 6 conceptually depicts a portion of another CDAC array 400, e.g., DAC 210 of FIG. 3, that can include a plurality of capacitors 402A-402I (collectively referred to as "capacitors 402"). Similar to what was described above with respect to FIG. 4, the plurality of capacitors 402 of the CDAC array 400 can be grouped into at least one cluster. In this example, a first cluster 404 of capacitors and a second cluster 406 of capacitors are included. The specific example shown in FIG. 6 also depicts a third cluster 408 of capacitors. In other example configurations, there can be more or less than three clusters. Also shown in FIG. 6 is a capacitor bank 410 that includes a plurality of capacitors 412.

After the capacitors in the CDAC 400 have been grouped in clusters, e.g., first and second clusters 404, 406, various capacitors in the respective clusters can be grouped into combinations. For example, in the first cluster 404, the capacitors can be grouped into a first combination of capacitors 402A, 402B, and 402C, each having a nominal first weight, e.g., value of 16. As an example, capacitors 402A and 402B can represent a first bit B1 and capacitors 402C can represent a second bit B2. In some cases one or more extra capacitors, each having the nominal first weight, can be included. They can either function as calibration capacitors or work as redundant bit capacitors.

In the second cluster 406, the capacitors can be grouped into a first combination of capacitors 402D, 402E, and 402F, each having a nominal second weight, e.g., value of 4. As an example, capacitors 402D and 402E can represent a third bit B3 and capacitors 402F can represent a fourth bit B4. In some cases one or more extra capacitors, each having the nominal second weight, can be included. They can either function as calibration capacitors or as redundant bit capacitors. In some implementations there can be only one capacitor in some of the clusters.

The first and second nominal weights can be different to reflect the difference in bit weights between the two clusters. In FIG. 6, the difference in the first and second weights is depicted both graphically and numerically for purposes of explanation. For example, a capacitor in the first cluster 404, e.g., the capacitor 402A, is graphically depicted as being larger than a capacitor in the second cluster 406, and a capacitor in the second cluster 406 is graphically depicted as being larger than a capacitor in the third cluster 408. In addition, a capacitor in the first cluster 404, e.g., the capacitor 402A, is numerically depicted as being larger (value of 16) than a capacitor in the second cluster 406 (value of 4) (and the third cluster 408, value of 1). These specific numbers are for the purposes of explanation and are not to be considered limiting.

In some implementations, a capacitor in the first cluster 404, e.g., the capacitor 402A, may not actually be a larger capacitor than a capacitor in the first cluster 404, e.g., the capacitor 402D, but instead can include a greater number of the same size capacitors, e.g., unit capacitors. For example, a capacitor of the first cluster 404, e.g., the capacitor 402A, can include 16 unit capacitors and a capacitor of the second cluster 406, e.g., the capacitor 402D, can include 4 unit capacitors. In some examples, at least some of the capacitors in a cluster can include bit trial capacitors in addition to capacitors used for calibration purposes.

As mentioned above, in the example implementation of FIG. 6, the "swap" capacitors can be selected from capacitors in the capacitor bank 410. Some of the capacitors 412 in the capacitor bank 410 can be grouped, e.g., by the digital engine 222 of FIG. 3, into a combination of capacitors 414 having the nominal first weight of the first cluster 404, e.g., a combination of unit capacitors similar to the capacitor 402B of FIG. 6. Other capacitors of the capacitor bank 410 can be grouped into a combination of capacitors 416 having the nominal second weight of the second cluster 406, e.g., a combination of unit capacitors similar to the capacitor 402E of FIG. 6. In this case, the nominal first weight of the first cluster 404 is 16 so that the combination of capacitors 414 has 16 unit capacitors. In this manner, the swap capacitors in the clusters of FIG. 4 are eliminated and replaced by swap capacitors in the capacitor bank 410 such that the swapping occurs between each individual cluster and the capacitor bank 410.

An analog signal for sampling can be applied to an input of an ADC, e.g., the SAR ADC of FIG. 3. Then, a first sample of the analog signal can be acquired on at least some of the plurality of capacitors of the CDAC array 400 of FIG. 6, e.g., DAC 210 of FIG. 3. For example, the first sample can be acquired on at least some of the capacitors in the first cluster 404.

As mentioned above, using various techniques of this disclosure, the error, e.g., capacitor mismatch in the CDAC array, can be modulated and added to the input signal. Then, to extract an estimation of the error, the modulated error mixed with the input signal can be demodulated.

Capacitors between a cluster, e.g., first cluster 404, and the capacitor bank 410 can be "swapped." For example, the capacitors 402B of the first cluster 404 can receive a first reference voltage, e.g., a positive reference voltage. The error can be modulated by selecting a combination, or first group, of capacitors 414 from the capacitor bank 410 having the nominal first weight and applying a second reference voltage, e.g., a negative reference voltage, such that the capacitors 414 are complementary to the capacitors 402B. In some example implementations, the ADC can perform the selection using a pattern, e.g., on a pseudo-random basis.

In some example implementations and as seen in FIG. 6, half of the capacitors in the capacitor bank 410 are "1" and half of the capacitors in the capacitor bank are "00", and the capacitors can be dynamically decided to be set to "1" or "0" from sample to sample. As such, they can swap either way. In some implementations, these capacitors in capacitor bank 410 can be used to sample dither offset.

In some example implementations, the combination, or first groups 414 of capacitors can be dynamically selected from amongst the capacitors in the capacitor bank 410. Dynamically selecting capacitors from amongst the capacitors can include at least one of the following techniques: randomly selecting, pseudo-randomly selecting, barrel-shifting, and deterministically selecting from amongst the capacitors 412 in the capacitor bank 410.

Continuing with the example from above, an ADC, e.g., the SAR ADC of FIG. 3, can perform a first analog-to-digital conversion of the analog sample using the capacitors in at least the first clusters 404 to generate a first digital output D1. For example, the DAC 210 of FIG. 3 can use the first combination of capacitors 402A, 402B, and 402C of the first cluster 404 to generate a first digital output D1.

Next, a digital engine, e.g., the digital engine 222 of FIG. 3, can select the plurality of capacitors 414 where a sum of the weights of the selected capacitors equals a sum of the weights of the capacitors 402B of the first cluster 404 to form a swapping pair. For example, the selected capacitors 414 collectively have a weight of 16 and the capacitors of 402B also have a weight of 16, and the capacitor 414 is complementary to 402B, e.g. the swapping is complementary. That is, if capacitors 402B receive a positive reference voltage, the capacitors 414 of the capacitor bank 410 receive a negative reference voltage.

Next, the ADC can apply the second reference voltage, e.g., a negative reference voltage, to the first combination of capacitors 402B and apply the first reference voltage, e.g., a positive reference voltage, to the previously selected first group of capacitors 414 of the capacitor bank 410 to which the second reference voltage was previously applied. In this manner, equally weighted capacitors have been "swapped" between a cluster and the capacitor bank.

On the same analog sample, the ADC, e.g., the SAR ADC of FIG. 3, can perform at least a partial second analog-to-digital conversion using the first combination to generate a second digital output D2. Continuing the example above, the DAC 210 of FIG. 3 can use the first combination of capacitors 402A, 402B, and 402C of the first cluster 404 and the first combination of 402D, 402E, and 402F of the second cluster 406 to generate a second digital output D2. Again, the ADC performs the conversion on the same analog sample.

After generating the two digital outputs D1 and D2, a controller, e.g., the digital engine 225 of FIG. 3, can determine a difference between the first digital output D1 and the second digital output D2 to generate an estimate of a first error of the plurality of capacitors. Again, this estimate of error can represent the misweighting between the capacitors of groups 402B and 414. The ADC can, for example, store the first error in a data structure in a memory device, e.g., the memory 226 of FIG. 3, that relates the determined first error to the capacitors in the capacitor bank 410. That is, the ADC can store a correspondence between a representation of the estimate of the first error and the first group of capacitors from the first plurality of capacitors and the first group of capacitors from the second plurality of capacitors.

In some implementations, the swapping can be performed after capacitor 402B's reference voltage is decided by the ADC conversion process, e.g., bit trial in SAR ADC. For example, if capacitor 402B is set to "1" by a bit trial decision, an equal value of capacitors 414, which is set to "0", can be selected as a swapping capacitor. Then capacitor 402B can be set to "0" and capacitor 414 can be set to "1" before continuing with the ADC conversion process to generate the first result D1.

A small extra residue error can be added due to any mismatch between capacitor 402B and capacitor 414 in a SAR ADC by performing the swapping. However, if sufficient redundant capacitors are included in additional clusters, the additional clusters can have sufficient total weight to measure signal residue and this extra error. One reason for performing the swapping in the middle of a bit trial process can be to help ensure that the swapping capacitors' value is not correlated to the signal. Another solution that can help break the correlation between signal and swapping value can be to include another redundant capacitor in a cluster, so applying reference voltage to the redundant capacitor is completely independent from the bit trial process.

A similar process can be used to determine an error from capacitors in the second and third clusters 406, 408. That is, capacitors between the second cluster 406 and the capacitor bank 410 can be "swapped," and capacitors between the third cluster 408 and the capacitor bank 410 can be "swapped." For example, the capacitors 402E of the second cluster 406 can receive a first reference voltage, e.g., a positive reference voltage. The error can be modulated by selecting a combination of capacitors 416 from the capacitor bank 410 having the nominal second weight of the second cluster 406 and applying a second reference voltage, e.g., a negative reference voltage, such that the capacitors 414 are complementary to the capacitors 402E. For example, a digital engine, e.g., the digital engine 222 of FIG. 3, can select the plurality of capacitors 416 where a sum of the weights of the selected capacitors equals a sum of the weights of the capacitors 402E of the second cluster 406. For example, the selected capacitors 416 collectively have a weight of 4 and the capacitors of 402E also have a weight of 4.

In the manner described above with respect to the first cluster 404, an analog to digital conversion can be performed to generate a digital output, capacitors 402E of the second cluster can be swapped with capacitors 416 of the capacitor bank 410 by applying the second reference voltage to the capacitors 402E and applying the first reference voltage to the group of capacitors 416 of the capacitor bank 410 to which the second reference voltage was previously applied. Another analog to digital conversion can be performed to generate another digital output and a difference can be determined between the two digital outputs.

In configurations with a third cluster 408, as in FIG. 6, a similar process can be used to determine an error from capacitors in the third clusters 408 and the capacitor bank 410.

By using these techniques, the mismatch error of the capacitors can be determined. As described above and in accordance with this disclosure, the capacitors within respective clusters can be "shuffled" and regrouped, and then selected in the manner described above to determine further estimates of error.

Figure 7:
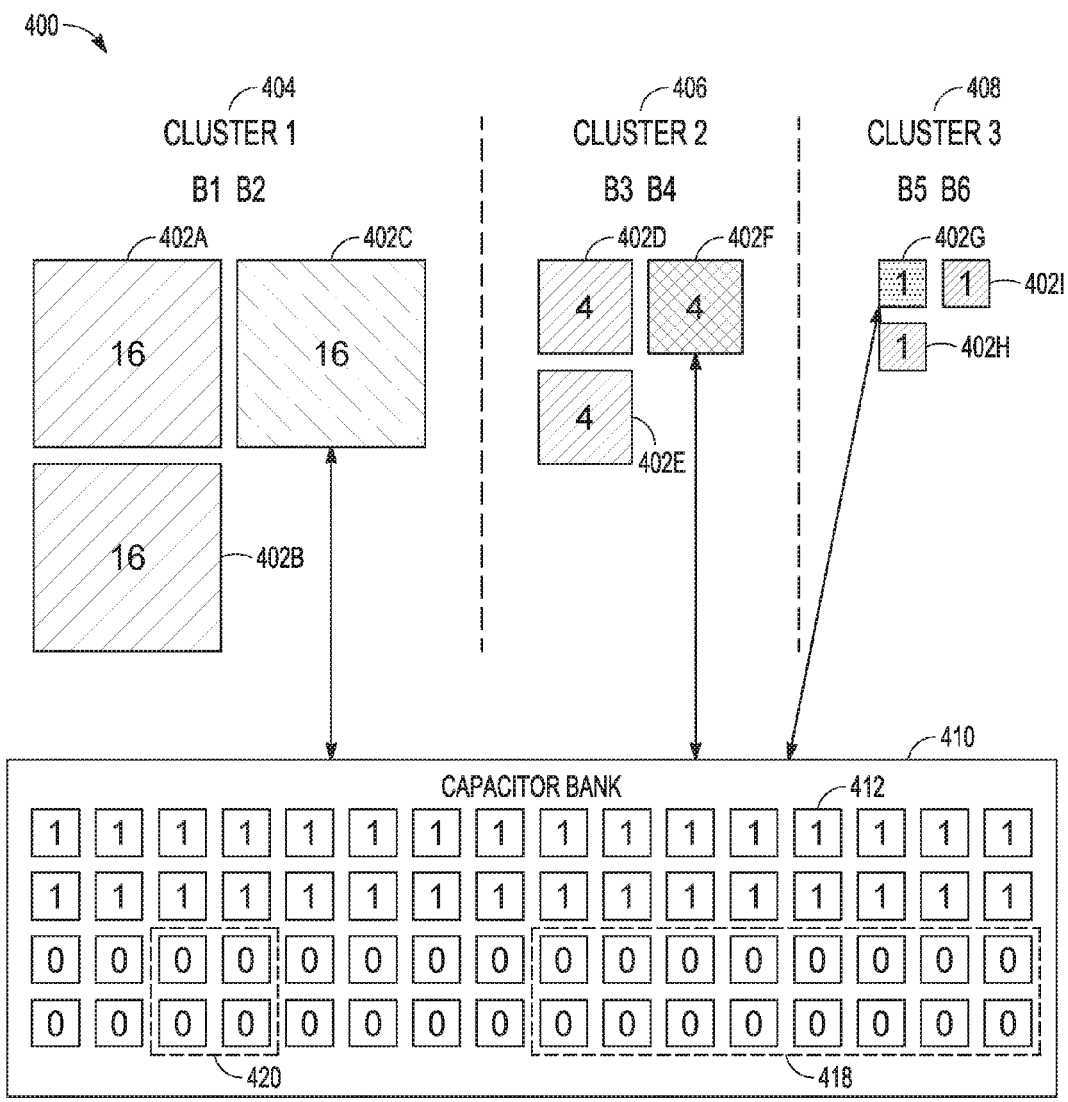
FIG. 7 is a simplified conceptual diagram depicting an example background calibration technique in accordance with this disclosure.

FIG. 7 is a simplified conceptual diagram depicting an example background calibration technique in accordance with this disclosure. FIG. 7 conceptually depicts the portion of the CDAC array and capacitor bank of FIG. 6 after a "shuffling" of capacitors in respective clusters. Continuing with the example above, a digital engine, e.g., digital engine 222 of FIG. 3, can group the first cluster 404 into a second combination of capacitors having a nominal first weight and can group the second cluster 406 into a second combination of capacitors having a nominal second weight different than the nominal first weight. In other words, the capacitors within a cluster, e.g., first cluster 404, can be grouped together in different combinations, or regrouped.

In the first cluster 404, the capacitors can be grouped into a second combination of capacitors each having a nominal first weight, e.g., for representing first and second bits B1, B2. In the second cluster 406, the capacitors can be grouped into a second combination of capacitors, each having a nominal second weight, e.g., for representing third and fourth bits B3, B4. Again, this regrouping into a second combination within clusters can be referred to as "shuffling" of the capacitors.

Similarly, the capacitors within the capacitors bank 410 that form the swap capacitors can be regrouped into different combinations. Some of the capacitors in the capacitor bank can be regrouped, e.g., by the digital engine 222 of FIG. 3, into a second combination of capacitors 418 having the nominal first weight of the first cluster 404, e.g., value of 16, and other capacitors of the capacitor bank 410 can be grouped into a second combination of capacitors 420 having the nominal second weight of the second cluster, e.g., value of 4.

After "shuffling", the process of estimating errors can be repeated using the new grouping of capacitors. That is, two digital outputs can be generated and a controller, e.g., the digital engine 225 of FIG. 3, can determine a difference between the digital outputs to generate an estimate of an error of the plurality of capacitors. Again, this estimate of error can represent the misweighting between the capacitors. The ADC can, for example, store the error in a data structure in a memory device, e.g., the memory 226 of FIG. 3, that relates the determined second error to the capacitors that were selected in the capacitor bank 410. That is, the ADC can store a correspondence between a representation of the estimate of the second error and the plurality of the second combinations of capacitors in the capacitor bank 410.

The techniques described above with respect to FIGS. 6 and 7 can be performed in the background until the ADC has determined and stored a sufficient number of correspondences between representations of the error estimates and the combinations of capacitors in the first and second (or more) clusters and the capacitor bank 410 that were used to determine the errors. In this manner, the ADC can determine error estimates for some or all of the capacitors in the CDAC array.

In some example implementations and as mentioned above with respect to FIG. 2, the ADC can apply a filter to the determined differences in order to refine the estimate error. As an example, the filter can include an integrator. In some example, the filter can be a digital filter.

As mentioned above with respect to FIG. 2, the estimated error can be applied at the error source, e.g., CDAC array, and used to correct the ADC output. For example, the ADC, e.g., of FIG. 3, can apply an analog signal 224 representing the error estimate to the DAC 210. In other example implementations, the estimated error can be applied digitally to the ADC digital output to correct for the error. For example, the digital engine, e.g., digital engine 225 of FIG. 3, can apply a digital representation of the error estimate to the digital output Dout to correct the ADC output.

Figure 8:
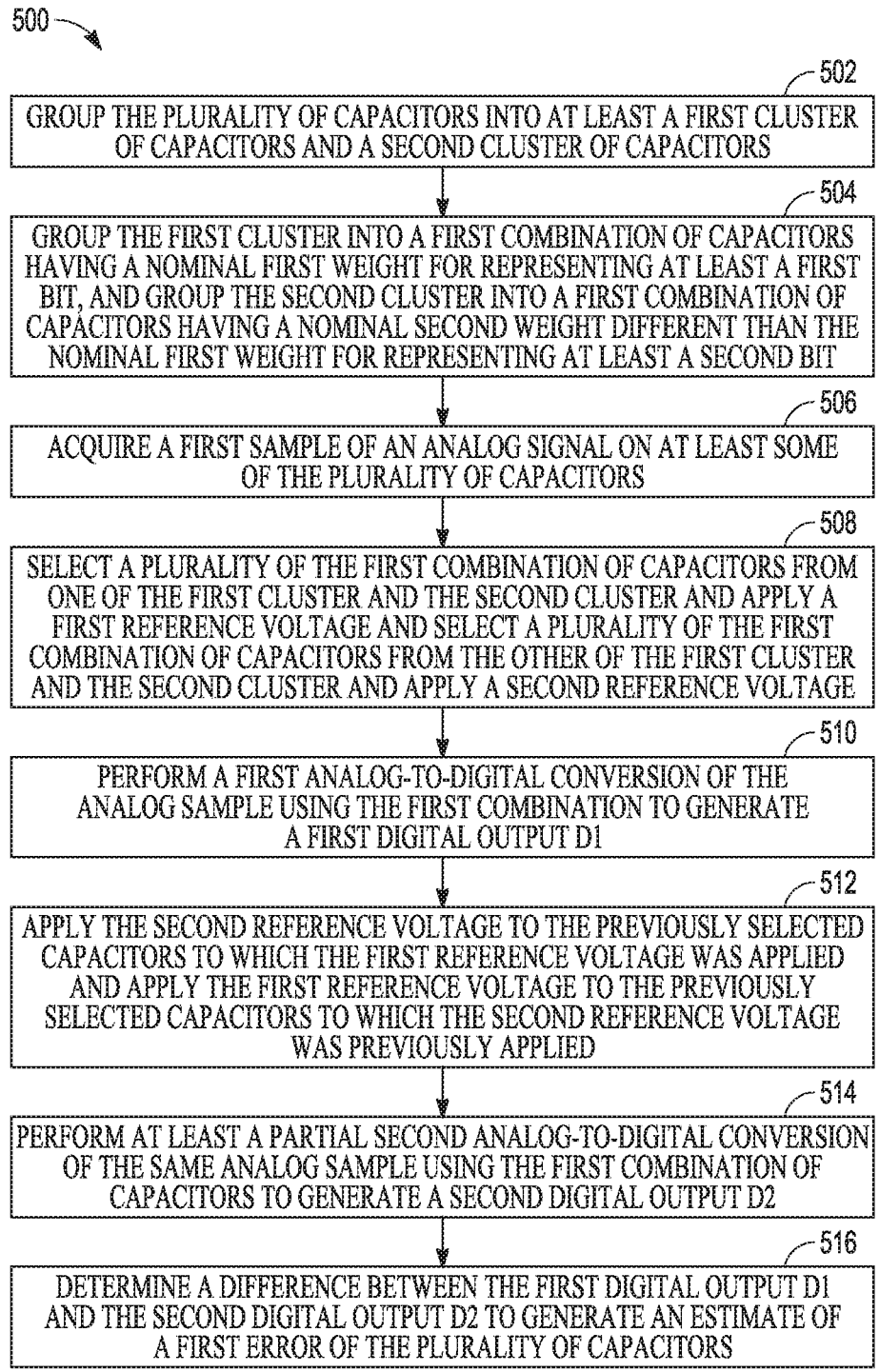
FIG. 8 is a flow diagram depicting an example method of background calibration in an analog-to-digital converter system.

FIG. 8 is a flow diagram depicting an example method of background calibration in an analog-to-digital converter system. In particular, FIG. 8 depicts a method 500 of performing a calibration, e.g., background calibration, for an analog-to-digital converter system, e.g., ADC of FIG. 3, that includes a plurality of capacitors. The method of FIG. 8 was described in detail above with respect to FIGS. 4 and 5, for example.

In FIG. 8, a controller, e.g., SAR logic 220 of FIG. 3, can group the plurality of capacitors into at least a first cluster of capacitors and a second cluster of capacitors (block 502). The controller can group the first cluster into a first combination of capacitors having a nominal first weight for representing at least a first bit, and grouping the second cluster into a first combination of capacitors having a nominal second weight different than the nominal first weight for representing at least a second bit (block 504).

The ADC can acquire a first sample of an analog signal on at least some of the plurality of capacitors (block 506). It should be noted that in some example implementations, the acquisition can occur before the grouping in blocks 502 and 504. The controller can select a plurality of the first combination of capacitors from one of the first cluster and the second cluster and apply a first reference voltage, e.g., positive reference voltage, and selecting a plurality of the first combination of capacitors from the other of the first cluster and the second cluster and apply a second reference voltage, e.g., a negative reference voltage, where a sum of the weights of the selected capacitors to which the first reference voltage was applied equals a sum of the weights of the selected capacitors to which the second reference voltage was applied (block 508).

The controller, e.g., SAR logic 220 of FIG. 3, can perform a first analog-to-digital conversion of the analog sample using the first combination to generate a first digital output D1 (block 510). The ADC can then apply the second reference voltage to the previously selected capacitors to which the first reference voltage was applied and apply the first reference voltage to the previously selected capacitors to which the second reference voltage was previously applied (block 512).

The controller can perform at least a partial second analog-to-digital conversion of the same analog sample using the first combination of capacitors to generate a second digital output D2 (block 514), and then determine a difference between the first digital output D1 and the second digital output D2 to generate an estimate of a first error of the plurality of capacitors (block 516).

Figure 9:
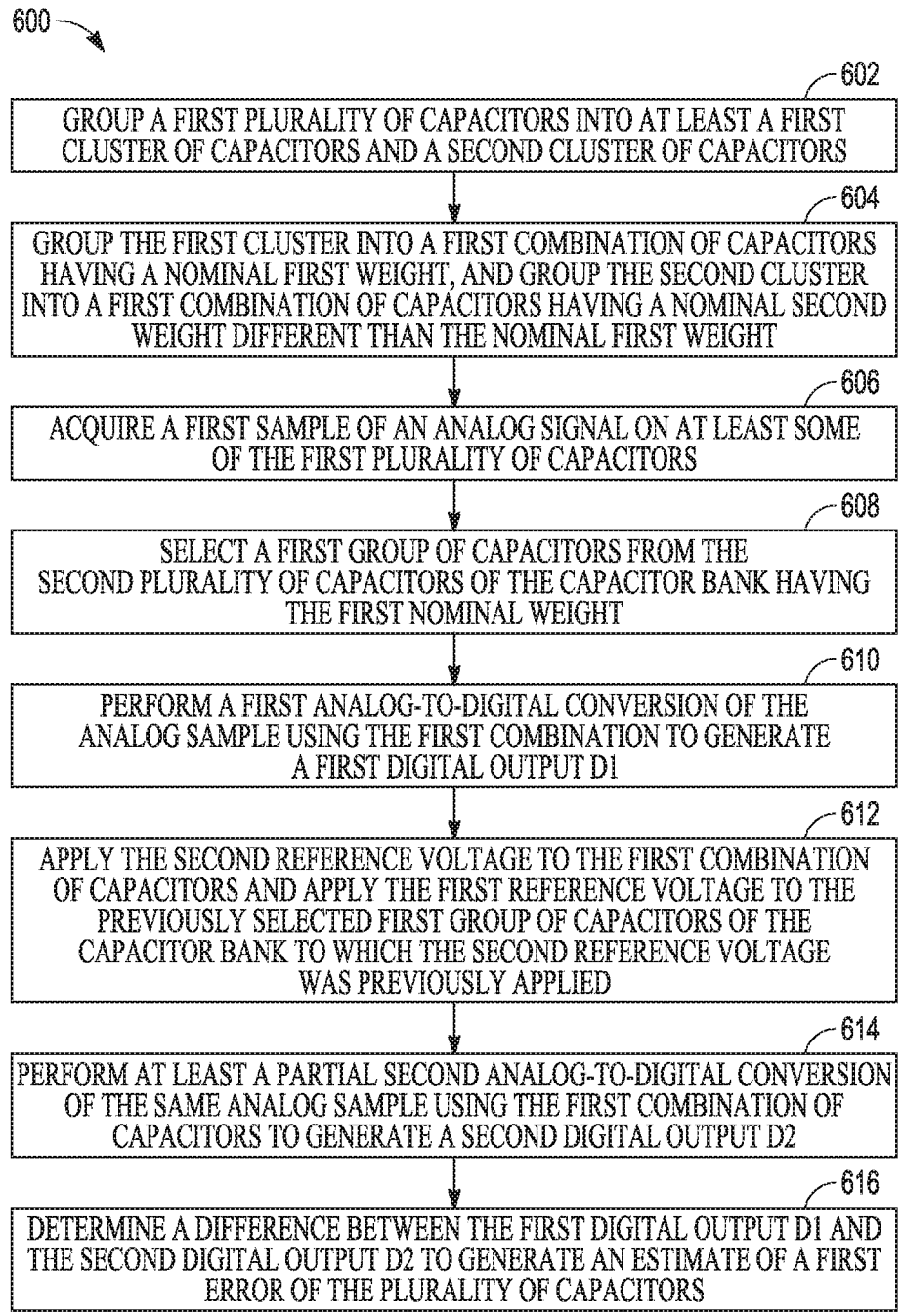
FIG. 9 is a flow diagram depicting another example method of background calibration in an analog-to-digital converter system.

FIG. 9 is a flow diagram depicting another example method of background calibration in an analog-to-digital converter system. In particular, FIG. 9 depicts a method 600 of performing a calibration for an analog-to-digital converter system, e.g., ADC of FIG. 3, that includes a capacitive digital to analog converter having a first plurality of capacitors and a capacitor bank having a second plurality of capacitors. The method of FIG. 9 was described in detail above with respect to FIGS. 6 and 7, for example.

In FIG. 9, a controller, e.g., SAR logic 220 of FIG. 3, can group the first plurality of capacitors into at least a first cluster of capacitors and a second cluster of capacitors (block 602). The controller can grouping the first cluster into a first combination of capacitors having a nominal first weight, and grouping the second cluster into a first combination of capacitors having a nominal second weight different than the nominal first weight (block 604).

The ADC can acquire a first sample of an analog signal on at least some of the first plurality of capacitors (block 606). It should be noted that in some example implementations, the acquisition can occur before the grouping in blocks 602 and 604. The controller can select a first group of capacitors from the second plurality of capacitors of the capacitor bank having the first nominal weight, (block 608).

The controller, e.g., SAR logic 220 of FIG. 3, can perform a first analog-to-digital conversion of the analog sample using the first combination to generate a first digital output D1 (block 610). Then, the controller can apply the second reference voltage to the first combination of capacitors and apply the first reference voltage to the previously selected first group of capacitors of the capacitor bank to which the second reference voltage was previously applied (block 612).

The controller can perform at least a partial second analog-to-digital conversion of the same analog sample using the first combination of capacitors to generate a second digital output D2 (block 614), and then determine a difference between the first digital output D1 and the second digital output D2 to generate an estimate of a first error of the plurality of capacitors (block 616).

VARIOUS NOTES

Aspect 1 includes subject matter (such as a method, means for performing acts, machine readable medium including instructions that when performed by a machine cause the machine to performs acts, or an apparatus configured to perform) of performing a calibration for an analog-to-digital converter system that includes a plurality of capacitors, the subject matter comprising: acquiring a first sample of an analog signal on at least some of the plurality of capacitors; grouping the plurality of capacitors into at least a first cluster of capacitors and a second cluster of capacitors; grouping the first cluster into a first combination of capacitors having a nominal first weight for representing at least a first bit, and grouping the second cluster into a first combination of capacitors having a nominal second weight different than the nominal first weight for representing at least a second bit; selecting a plurality of the first combination of capacitors from one of the first cluster and the second cluster and applying a first reference voltage and selecting a plurality of the first combination of capacitors from the other of the first cluster and the second cluster and applying a second reference voltage, wherein a sum of the weights of the selected capacitors to which the first reference voltage was applied equals a sum of the weights of the selected capacitors to which the second reference voltage was applied; performing a first analog-to-digital conversion of the analog sample using the first combination to generate a first digital output D1; applying the second reference voltage to the previously selected capacitors to which the first reference voltage was applied and applying the first reference voltage to the previously selected capacitors to which the second reference voltage was previously applied; performing at least a partial second analog-to-digital conversion of the same analog sample using the first combination of capacitors to generate a second digital output D2; and determining a difference between the first digital output D1 and the second digital output D2 to generate an estimate of a first error of the plurality of capacitors.

In Aspect 2, the subject matter of Aspect 1 can optionally include, grouping the first cluster into a second combination of capacitors having a nominal first weight for representing at least a first bit, and grouping the second cluster into a second combination of capacitors having a nominal second weight different than the nominal first weight for representing at least a second bit; acquiring a second sample of the analog signal on at least some of the plurality of capacitors; selecting a plurality of the second combination of capacitors from one of the first cluster and the second cluster and applying the first reference voltage and selecting a plurality of the second combination of capacitors from the other of the first cluster and the second cluster and applying a second reference voltage, wherein a sum of the weights of the selected capacitors to which the first reference voltage was applied equals a sum of the weights of the selected capacitors to which the second reference voltage was applied; performing a first analog-to-digital conversion of the second analog sample using the second combination of capacitors to generate a third digital output D3; applying the second reference voltage to the previously selected capacitors to which the first reference voltage was applied and the applying the first reference voltage to the previously selected capacitors to which the second reference voltage was previously applied; performing at least a partial second analog-to-digital conversion of the same second analog sample using the second combination of capacitors to generate a fourth digital output D4; and determining a difference between the third digital output D3 and the fourth digital output D4 to generate an estimate of a second error of the plurality of capacitors.

In Aspect 3, the subject matter of one or more of Aspects 1-2 can optionally include, storing a correspondence between a representation of the estimate of the first error and the plurality of the first combinations of capacitors in the first and second clusters.

In Aspect 4, the subject matter of one or more of Aspects 1-3 can optionally include, applying a filter to the determined difference to refine the estimated error.

In Aspect 5, the subject matter of one or more of Aspects 1-4 can optionally include, applying an analog signal representing the estimate of the first error to the analog-to-digital converter system.

In Aspect 6, the subject matter of one or more of Aspects 1-4 can optionally include, applying a digital signal representing the estimate of the first error to a digital output.

In Aspect 7, the subject matter of one or more of Aspects 1-6 can optionally include, wherein selecting a plurality of the first combination of capacitors from one of the first cluster and the second cluster includes: dynamically selecting a plurality of the first combination of capacitors from one of the first cluster and the second cluster.

In Aspect 8, the subject matter of Aspect 7 can optionally include, wherein dynamically selecting includes at least one of: randomly selecting, pseudo-randomly selecting, barrel-shifting, and deterministically selecting.

In Aspect 9, the subject matter of one or more of Aspects 1-8 can optionally include, wherein grouping the first cluster into a first combination of capacitors having a nominal first weight for representing at least a first bit, and grouping the second cluster into a first combination of capacitors having a nominal second weight different than the first weight for representing at a least second bit includes: in a capacitive digital to analog converter, grouping the first cluster into a first combination of capacitors having a nominal first weight for representing at least a first bit, and grouping the second cluster into a first combination of capacitors and having a nominal second weight different than the nominal first weight for representing at least a second bit.

In Aspect 10, the subject matter of one or more of Aspects 1-9 can optionally include, wherein performing a first analog-to-digital conversion of the analog sample using the first combination to generate a first digital output D1 comprises: performing, using a successive approximation routine (SAR) algorithm, a first analog-to-digital conversion of the analog sample using the first combination to generate a first digital output D1.

Aspect 11 includes subject matter (such as a method, means for performing acts, machine readable medium including instructions that when performed by a machine cause the machine to performs acts, or an apparatus configured to perform) of performing a calibration for an analog-to-digital converter system that includes a plurality of capacitors, the subject matter comprising: acquiring a first sample of an analog signal on at least some of the first plurality of capacitors; grouping the first plurality of capacitors into at least a first cluster of capacitors and a second cluster of capacitors; grouping the first cluster into a first combination of capacitors having a nominal first weight to receive a first reference voltage and grouping the second cluster into a first combination of capacitors having a nominal second weight different than the nominal first weight; selecting a first group of capacitors from the second plurality of capacitors of the capacitor bank having the first nominal weight and applying a second reference voltage; performing a first analog-to-digital conversion of the analog sample using the first combination to generate a first digital output D1; applying the second reference voltage to the first combination of capacitors and applying the first reference voltage to the previously selected first group of capacitors of the capacitor bank to which the second reference voltage was previously applied; performing at least a partial second analog-to-digital conversion of the same analog sample using the first combination of capacitors to generate a second digital output D2; and determining a difference between the first digital output D1 and the second digital output D2 to generate an estimate of a first error of the plurality of capacitors.

In Aspect 12, the subject matter of Aspect 11 can optionally include, grouping the first cluster into a second combination of capacitors having the nominal first weight to receive the first reference voltage, and grouping the second cluster into a second combination of capacitors having the nominal second weight different than the nominal first weight; acquiring a second sample of the analog signal on at least some of the first plurality of capacitors; selecting a second group of capacitors from the second plurality of capacitors of the capacitor bank and applying the second reference voltage; performing a second analog-to-digital conversion of the second analog sample using the second combination of capacitors to generate a third digital output D3; applying the second reference voltage to the second combination of capacitors and applying the first reference voltage to the previously selected second group of capacitors of the capacitor bank to which the second reference voltage was previously applied; performing at least a partial second analog-to-digital conversion of the same second analog sample using the second combination of capacitors to generate a fourth digital output D4; and determining a difference between the third digital output D3 and the fourth digital output D4 to generate an estimate of a second error of the plurality of capacitors.

In Aspect 13, the subject matter of one or more of Aspects 11-12 can optionally include, storing a correspondence between a representation of the estimate of the first error and the first group of capacitors from the second plurality of capacitors and the second group of capacitors from the second plurality of capacitors.

In Aspect 14, the subject matter of one or more of Aspects 11-13 can optionally include, applying a filter to the determined difference to refine the estimated error.

In Aspect 15, the subject matter of one or more of Aspects 11-14 can optionally include, applying an analog signal representing the estimate of the first error to the analog-to-digital converter system.

In Aspect 16, the subject matter of one or more of Aspects 11-14 can optionally include, applying a digital signal representing the estimate of the first error to a digital output.

In Aspect 17, the subject matter of one or more of Aspects 11-16 can optionally include, wherein selecting a first group of capacitors from the second plurality of capacitors includes: dynamically selecting a first plurality of capacitors from the second plurality of capacitors.

In Aspect 18, the subject matter of Aspect 17 can optionally include, wherein dynamically selecting includes at least one of: randomly selecting, pseudo-randomly selecting, barrel-shifting, and deterministically selecting.

In Aspect 19, the subject matter of Aspect 11-18 can optionally include, wherein performing a first analog-to-digital conversion of the analog sample using the first combination to generate a first digital output D1 comprises: performing, using a successive approximation routine (SAR) algorithm, a first analog-to-digital conversion of the analog sample using the first combination to generate a first digital output D1.

Aspect 20 includes subject matter (such as a device, system, circuit, apparatus, or machine) for synchronizing a plurality of sampling channels, the subject matter comprising: means for acquiring a first sample of an analog signal on at least some of the plurality of capacitors; means for grouping the plurality of capacitors into at least a first cluster of capacitors and a second cluster of capacitors; means for grouping the first cluster into a first combination of capacitors having a nominal first weight for representing at least a first bit, and grouping the second cluster into a first combination of capacitors having a nominal second weight different than the nominal first weight for representing at least a second bit; means for selecting a plurality of the first combination of capacitors from one of the first cluster and the second cluster and applying a first reference voltage and selecting a plurality of the first combination of capacitors from the other of the first cluster and the second cluster and applying a second reference voltage, wherein a sum of the weights of the selected capacitors to which the first reference voltage was applied equals a sum of the weights of the selected capacitors to which the second reference voltage was applied; means for performing a first analog-to-digital conversion of the analog sample using the first combination to generate a first digital output D1; means for applying the second reference voltage to the previously selected capacitors to which the first reference voltage was applied and applying the first reference voltage to the previously selected capacitors to which the second reference voltage was previously applied; means for performing at least a partial second analog-to-digital conversion of the same analog sample using the first combination of capacitors to generate a second digital output D2; and means for determining a difference between the first digital output D1 and the second digital output D2 to generate an estimate of a first error of the plurality of capacitors.

Each of the non-limiting aspects or examples described herein may stand on its own, or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "aspects" or "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

For example, while the impedance elements and the switches are shown in one order between the input terminals and the summing nodes in the drawings, this should not be construed as limiting, because in various embodiments, the impedance elements and the switches may be disposed in a different order while maintaining the same functional performance, according to the understanding of one of ordinary skill in the art in view of the teachings herein. In addition, a single impedance element in the drawings may be replaced by a plurality of different impedance elements while maintaining a same functional performance, and a single switch in the figures may be replaced by a plurality of different switches while maintaining a same functional performance, according to the understanding of one of ordinary skill in the art in view of the teachings herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

What is claimed is:

1. A method of performing a calibration for an analog-to-digital converter system that includes a plurality of capacitors, the method comprising:
   acquiring a first sample of an analog signal on at least some of the plurality of capacitors;
   grouping the plurality of capacitors into at least a first cluster of capacitors and a second cluster of capacitors;
   selecting a combination of capacitors from the first cluster and applying a first reference voltage and selecting a combination of capacitors from the second cluster and applying a different second reference voltage;
   performing a first analog-to-digital conversion of the analog sample to generate a first digital output D1;
   applying the second reference voltage to the previously selected capacitors to which the first reference voltage was applied and applying the first reference voltage to the previously selected capacitors to which the second reference voltage was previously applied;
   performing at least a partial second analog-to-digital conversion of the same analog sample to generate a second digital output D2; and
   determining a difference between the first digital output D1 and the second digital output D2 to generate an estimate of a first error of at least one of the plurality of capacitors.

2. The method of claim 1, comprising:
   grouping the first cluster into a first combination of capacitors having a nominal first weight for representing at least a first bit, and grouping the second cluster into a first combination of capacitors having a nominal second weight different than the nominal first weight for representing at least a second bit,
   wherein selecting a combination of capacitors from the first cluster and applying a first reference voltage and selecting a combination of capacitors from the second cluster and applying a different second reference voltage includes: selecting a plurality of the first combination of capacitors from one of the first cluster and the second cluster and applying a first reference voltage and selecting a plurality of the first combination of capacitors from the other of the first cluster and the second cluster and applying a different second reference voltage, wherein a sum of the weights of the selected capacitors to which the first reference voltage was applied equals a sum of the weights of the selected capacitors to which the second reference voltage was applied,
   wherein performing a first analog-to-digital conversion of the analog sample to generate a first digital output D1 includes performing a first analog-to-digital conversion of the analog sample using the first combination to generate a first digital output D1, and
   wherein performing at least a partial second analog-to-digital conversion of the same analog sample to generate a second digital output D2 includes performing a first analog-to-digital conversion of the analog sample using the first combination to generate a first digital output D1.

3. The method of claim 2, further comprising:
   grouping the first cluster into a second combination of capacitors having a nominal first weight for representing at least a first bit, and grouping the second cluster into a second combination of capacitors having a nominal second weight different than the nominal first weight for representing at least a second bit;
   acquiring a second sample of the analog signal on at least some of the plurality of capacitors;
   selecting a plurality of the second combination of capacitors from one of the first cluster and the second cluster and applying the first reference voltage and selecting a plurality of the second combination of capacitors from the other of the first cluster and the second cluster and applying a second reference voltage, wherein a sum of the weights of the selected capacitors to which the first reference voltage was applied equals a sum of the weights of the selected capacitors to which the second reference voltage was applied;
   performing a first analog-to-digital conversion of the second analog sample using the second combination of capacitors to generate a third digital output D3;
   applying the second reference voltage to the previously selected capacitors to which the first reference voltage was applied and the applying the first reference voltage to the previously selected capacitors to which the second reference voltage was previously applied;
   performing at least a partial second analog-to-digital conversion of the same second analog sample using the second combination of capacitors to generate a fourth digital output D4; and
   determining a difference between the third digital output D3 and the fourth digital output D4 to generate an estimate of a second error of the plurality of capacitors.

4. The method of claim 2, wherein grouping the first cluster into a first combination of capacitors having a nominal first weight for representing at least a first bit, and grouping the second cluster into a first combination of capacitors having a nominal second weight different than the first weight for representing at a least second bit includes:
   in a capacitive digital to analog converter, grouping the first cluster into a first combination of capacitors having a nominal first weight for representing at least a first bit, and grouping the second cluster into a first combination of capacitors and having a nominal second weight different than the nominal first weight for representing at least a second bit.

5. The method of claim 1, further comprising:
   storing a correspondence between a representation of the estimate of the first error and at least one of the plurality of the combinations of capacitors in the first and second clusters.

6. The method of claim 1, further comprising:
   applying a filter to the determined difference to refine the estimated first error.

7. The method of claim 1, further comprising:
   applying an analog signal representing the estimate of the first error to the analog-to-digital converter system.

8. The method of claim 1, further comprising:
   applying a digital signal representing the estimate of the first error to a digital output.

9. The method of claim 1, wherein selecting combination of capacitors from the first cluster includes:

dynamically selecting a combination of capacitors from the first cluster.

10. The method of claim 9, wherein dynamically selecting includes at least one of:
randomly selecting, pseudo-randomly selecting, barrel-shifting, and deterministically selecting.

11. The method of claim 1, wherein performing a first analog-to-digital conversion of the analog sample to generate a first digital output D1 comprises:
performing, using a successive approximation routine (SAR) algorithm, a first analog-to-digital conversion of the analog sample to generate a first digital output D1.

12. A method of performing a calibration for an analog-to-digital converter system that includes a capacitive digital to analog converter (DAC) having capacitors and a capacitor bank having capacitors, the method comprising:
acquiring a first sample of an analog signal on at least some of the DAC capacitors;
grouping the DAC capacitors into at least a first cluster and a second cluster;
selecting a combination of capacitors in the first cluster and applying a first reference voltage;
selecting a combination of capacitors in the capacitor bank and applying a different second reference voltage;
performing a first analog-to-digital conversion of the analog sample using the selected combinations to generate a first digital output D1;
applying the second reference voltage to the previously selected combination of capacitors in the first cluster and applying the first reference voltage to the previously selected combination of capacitors in the capacitor bank to which the second reference voltage was previously applied;
performing at least a partial second analog-to-digital conversion of the same analog sample using the selected combinations of capacitors to generate a second digital output D2; and
determining a difference between the first digital output D1 and the second digital output D2 to generate an estimate of a first error of at least one of the capacitors in the capacitor bank and the DAC.

13. The method of claim 12, comprising:
grouping the first cluster into a first combination of capacitors having a nominal first weight to receive the first reference voltage and grouping the second cluster into a first combination of capacitors having a nominal second weight different than the nominal first weight,
wherein the capacitors in the DAC include a first plurality of capacitors,
wherein the capacitors in the capacitor bank include a second plurality of capacitors,
wherein acquiring a first sample of an analog signal on at least some of the DAC capacitors includes acquiring a first sample of an analog signal on at least some of the first plurality of capacitors,
wherein grouping the DAC capacitors into at least a first cluster and a second cluster includes grouping the first plurality of capacitors into at least a first cluster of capacitors and a second cluster of capacitors,
wherein selecting a combination of capacitors in the first cluster and applying a first reference voltage includes selecting a first group of capacitors from the second plurality of capacitors of the capacitor bank having the first nominal weight and applying a second reference voltage,
wherein selecting a combination of capacitors in the capacitor bank and applying a different second reference voltage includes selecting a first group of capacitors from the second plurality of capacitors of the capacitor bank having the first nominal weight and applying a second reference voltage, and
wherein applying the second reference voltage to the previously selected combination of capacitors in the first cluster and applying the first reference voltage to the previously selected combination of capacitors in the capacitor bank to which the second reference voltage was previously applied includes applying the second reference voltage to the first combination of capacitors and applying the first reference voltage to the previously selected first group of capacitors of the capacitor bank to which the second reference voltage was previously applied.

14. The method of claim 13, further comprising:
grouping the first cluster into a second combination of capacitors having the nominal first weight to receive the first reference voltage, and grouping the second cluster into a second combination of capacitors having the nominal second weight different than the nominal first weight;
acquiring a second sample of the analog signal on at least some of the first plurality of capacitors;
selecting a second group of capacitors from the second plurality of capacitors of the capacitor bank and applying the second reference voltage;
performing a second analog-to-digital conversion of the second analog sample using the second combination of capacitors to generate a third digital output D3;
applying the second reference voltage to the second combinations of capacitors and applying the first reference voltage to the previously selected second group of capacitors of the capacitor bank to which the second reference voltage was previously applied;
performing at least a partial second analog-to-digital conversion of the same second analog sample using the second combinations of capacitors to generate a fourth digital output D4; and
determining a difference between the third digital output D3 and the fourth digital output D4 to generate an estimate of a second error of the plurality of capacitors.

15. The method of claim 12, further comprising:
storing a correspondence between a representation of the estimate of the first error and the selected combinations of capacitors.

16. The method of claim 12, further comprising:
applying a filter to the determined difference to refine the estimated first error.

17. The method of claim 12, further comprising:
applying an analog signal representing the estimate of the first error to the analog-to-digital converter system.

18. The method of claim 12, further comprising:
applying a digital signal representing the estimate of the first error to a digital output.

19. The method of claim 12, wherein selecting a combination of capacitors in the capacitor bank includes:
dynamically selecting a combination of capacitors in the capacitor bank.

20. The method of claim 19, wherein dynamically selecting includes at least one of:
randomly selecting, pseudo-randomly selecting, barrel-shifting, and deterministically selecting.

21. The method of claim 12, wherein performing a first analog-to-digital conversion of the analog sample using the selected combinations to generate a first digital output D1 comprises:

performing, using a successive approximation routine (SAR) algorithm, a first analog-to-digital conversion of the analog sample using the selected combinations to generate a first digital output D1.

22. A system for performing a calibration for an analog-to-digital converter system that includes a capacitive digital to analog converter (DAC) having capacitors and a capacitor bank having capacitors, the system comprising:
- means for acquiring a first sample of an analog signal on at least some of the DAC capacitors;
- means for grouping the DAC capacitors into at least a first cluster and a second cluster;
- means for selecting a combination of capacitors in the first cluster and applying a first reference voltage;
- means for selecting a combination of capacitors in the capacitor bank and applying a different second reference voltage;
- means for performing a first analog-to-digital conversion of the analog sample using the selected combinations to generate a first digital output D1;
- means for applying the second reference voltage to the previously selected combination of capacitors in the first cluster and applying the first reference voltage to the previously selected combination of capacitors in the capacitor bank;
- means for performing at least a partial second analog-to-digital conversion of the same analog sample using the selected combinations to generate a second digital output D2; and
- means for determining a difference between the first digital output D1 and the second digital output D2 to generate an estimate of a first error of at least one of capacitors in the capacitor bank and the DAC.

* * * * *